United States Patent [19]

Glock et al.

[11] 4,204,276

[45] May 20, 1980

[54] WRITE-READ DRIVE ARRANGEMENT FOR A BIPOLAR SEMICONDUCTOR MEMORY

[75] Inventors: Hans Glock, Hoefa; Herbert Mayer, Munich, both of Fed. Rep. of Germany

[73] Assignee: Siemens Aktiengesellschaft, Berlin & Munich, Fed. Rep. of Germany

[21] Appl. No.: 938,408

[22] Filed: Aug. 31, 1978

[30] Foreign Application Priority Data

Sep. 8, 1977 [DE] Fed. Rep. of Germany ....... 2740565

[51] Int. Cl.² .................................................. G11C 11/40
[52] U.S. Cl. ..................................... 365/189; 307/238
[58] Field of Search ............. 365/189, 191, 193, 230; 307/238

[56] References Cited

PUBLICATIONS

"High Speed Bipolar Monolithic Memories", Hans Glock et al., *Frequenz,* 29 (1975), 3, pp. 80–87.

*Primary Examiner*—Terrell W. Fears
*Attorney, Agent, or Firm*—Hill, Van Santen, Steadman, Chiara & Simpson

[57] ABSTRACT

A write-read drive arrangement for a bipolar semiconductor memory, arranged in the form of a matrix, and comprising a preliminary stage which can be driven by way of a right-end and data input, and which has two information outputs and a status output which is fed with operating state signals, and an intermediate and end stage which are connected following the preliminary stage and logically link a read-out amplifier to the bit lines of the individual storage cells and to the outputs of the preliminary stage is particularly characterized in that a circuit arrangement which connects the outputs of the preliminary stage to a first signal line and a second signal line of the end stage is provided as an intermediate stage and that each line of the storage matrix is assigned a maximum of one switching transistor which can be operated by way of the signal lines and logically links the bit lines to the inputs of the read-out amplifier.

2 Claims, 1 Drawing Figure

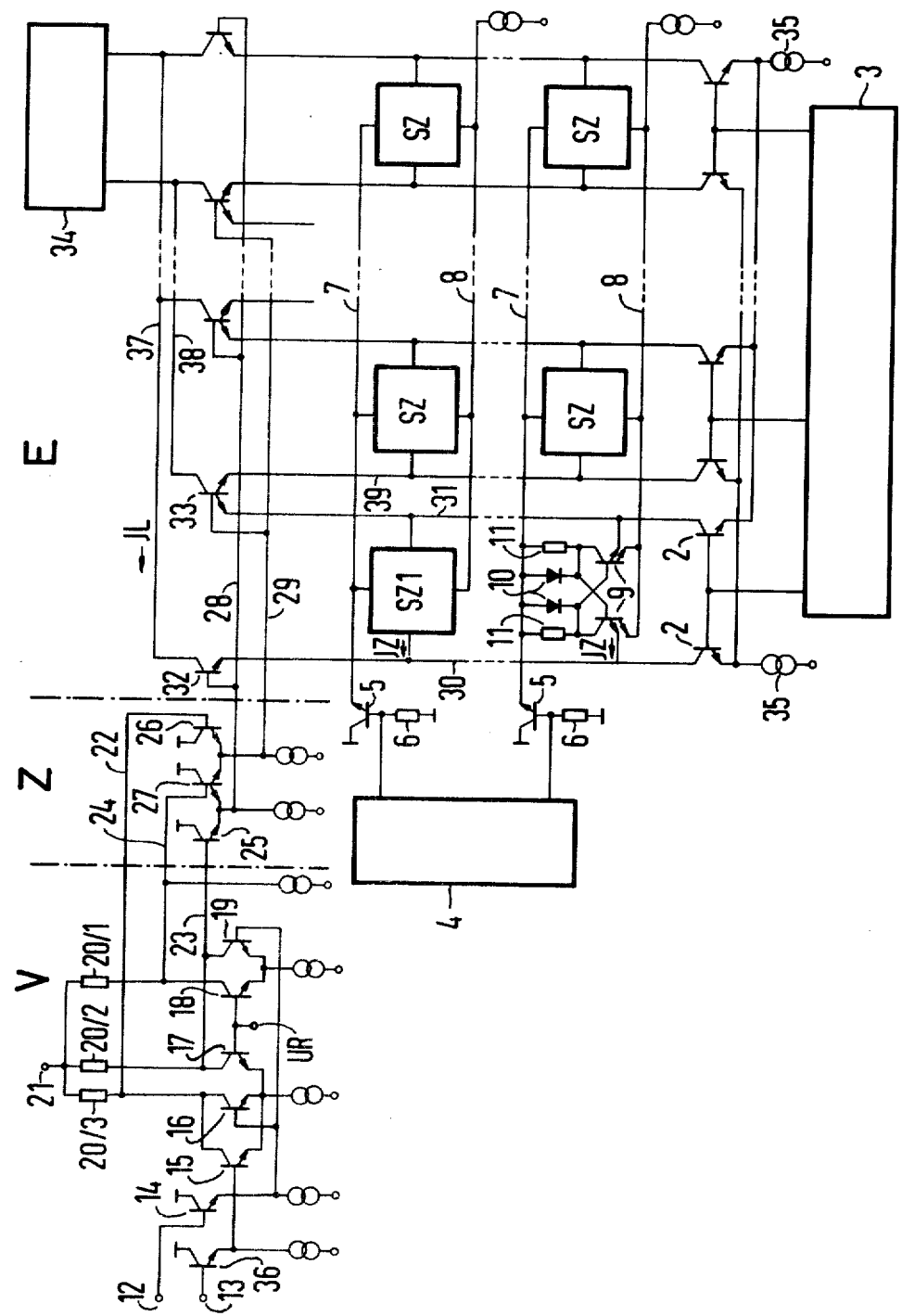

WRITE-READ DRIVE ARRANGEMENT FOR A BIPOLAR SEMICONDUCTOR MEMORY

BACKGROUND OF THE INVENTION

1. Field of the Invention

The present invention relates to a write-read drive arrangement for a bipolar semiconductor memory which is arranged in the form of a matrix comprises a preliminary stage which can be driven by way of by write-in and data input, and has two information outputs and a status output which is fed with operating state signals, and an intermediate stage and an end stage connected following the preliminary stage logically links a read-out amplifier to the bit lines of the individual cells and to the outputs of the preliminary stage.

2. Description of the Prior Art

In order to read items of information from a bipolar storage module, an address storage cell is operated by way of bit lines in such a manner that on one side of the conductive cell transistor the current in the read line leading to the reading amplifier approaches zero, whereas the current on the side of the blocked transistor cell corresponds to a current impressed by a current source. Different currents in the read-out lines are converted into a difference voltage in the reading amplifier and are amplified to the requisite output range.

The actual read-write drive arrangement comprises a preliminary stage which can be driven via a write-in and data input and which is adjoined by an intermediate and end stage. By means of suitable logic linkages and level conversions in the preliminary stage and intermediate and end stage, the various bit line potentials are produced. Here, the intermediate stage serves for level conversion and the end stage for final logic linking. A write-read control unit of this kind which is integrated on a chip in common with the storage cells, is now to be constructed in such a manner that the number of control transistors and, thus, the number of required contacts, and, likewise, the number of required signal lines is as small as possible.

SUMMARY OF THE INVENTION

The object of the present invention is to provide a write-read control arrangement comprising the smallest possible number of switching transistors and signal lines for a bipolar storage module.

Moreover, the circuit arrangement of the present invention is to exhibit the lowest possible power loss.

The foregoing object is realized, in accordance with the present invention, in that a circuit arrangement is provided which connects the outputs of the preliminary stage to a first and second signal line of the end stage by way of an intermediate stage, and that each bit line of the storage matrix is assigned a maximum of one switching transistor which can be operated by way of the signal lines and logically links the bit lines to the inputs of the read-out amplifier.

Advantageously, an arrangement constructed in accordance with the present invention allows the number of transistors and, thus, the number of required contacts to be kept low. The reduction in the signal lines to 2 lines which lead across the entire width of the storage matrix, in combination with the reduced number of transistors, results in a definite improvement in chip area. In addition, the power loss is substantially reduced, in particular in the region of the intermediate stage.

As one transistor per bit line always conducts current—thus also in the state of write-in—in the circuit arrangement constructed in accordance with the present invention, the binary signal to be stored in the selected cell can be read during write-in. A write-read simultaneous operation of this kind allows for an allowance, for example, a read-after-write check to be carried out.

BRIEF DESCRIPTION OF THE DRAWING

Other objects, features and advantages of the invention, its organization, construction and operation will be best understood from the following detailed description, taken in conjunction with the accompanying drawing, on which there is a single FIGURE which is a schematic circuit diagram of an exemplary embodiment of the invention and which illustrates a bipolar storage module comprising an integrated write-read control unit.

DETAILED DESCRIPTION OF THE PREFERRED EMBODIMENT

In the circuit arrangement illustrated on the drawing, a write-read storage module is constructed in the bipolar technique. On the drawing, a bit selector circuit 3 renders a plurality of switching transistors 2 conductive in order to select a storage cell SZ, for example, the storage cell SZ1. At the same time, by way of a word selector control unit 4, in combination with a switching transistor 5 and an associated resistor 6, a word is operated in that an upper word line 7 is connected to approximately $-0.9$ V, whereby a potential of approximately $-1.7$ V is set up on a lower word line 8.

As a result of this drive procedure, an individual storage cell—in this case the storage cell SZ1 is now addressed. The storage cell itself consists of two npn transistors which are connected to one another with a common emitter configuration and which are logically linked to one another in a known manner by way of a pair of diodes 10 and a pair of resistors 11. In order to read an item of information contained in a storage cell SZ of this kind, the storage cell SZ is operated by way of a write-read control unit having an input 12 and a data input 13. The write-read control unit fundamentally comprises three stages, namely a preliminary stage V, an intermediate stage Z and an end stage E. This write-read control unit corresponding to the present invention will be further described with reference to the individual operating stages "read" and "write".

In the operating state "read" the write-in input 12 is set at a potential corresponding to a logical "1" by way of a known circuit arrangement which has not been represented on the drawing. Therefore, the transistor 14 connects two differential amplifiers, subsequently provided as threshold value switches, and consisting of a plurality of transistors 15, 16 and 17, 18 and 19, to the reference voltage source UR. By way of a plurality of resistors 20, (20/3, 20/2, 20/1) which are logically linked to the reference potential source 21, the level of $-1.0$ V is set up at a first information input 22 and at a second information output 23, and a level of 0.6 V is set up at a status output 24. Therefore, the transistors 25 and 26 conduct, and a further transistor 27 having two emitters opens. By way of a first and second signal line 28 and 29, a pair of switching transistors 32 and 33 are logically linked to the bit lines 30 and 31 and are thus operated.

The switching transistors 32 and 33 logically link the bit lines 30 and 31 with a read-out amplifier 34 which is designed as a differential amplifier. A potential of −2.1 V is set up on the bit lines. The emitter of the conductive transistor of the selected storage cell SZ1, which is connected to the lower word line 8, is thus blocked so that the entire storage cell current IZ flows into the associcated bit line 30. As the current in the bit lines 30 and 31 is fed in by way of current sources 35 and thus remains unchanged, the read-out current IL flowing across the transistor 32 is reduced by the cell current IZ. The read-out amplifier 34 converts the differential currents in the read-out lines 37 and 38 into a difference voltage which is then fed to an actual differential amplifier stage.

Similarly to the previously described operating state "read", in the "write" operating state the write-in input 12 is connected to a potential corresponding to the logic state "0". If, for example, a "1" is to be written in, the data input 13 is connected to the potential corresponding to a "1", whereby the transistor 15 opens by way of the transistor 36. By way of the write-read control unit, the potentials on the bit lines 30 and 31 are thus changed in phase opposing fashion by approximately 0.4 V. Therefore, when a "1" is written in the bit line 30 carries approximately −1.7 V and the bit line 31 carries approximately −2.5 V.

In comparison to arrangements previously known in the art, the circuit arrangement constructed in accordance with the present invention requires a considerably smaller number of switching transistors and therefore the number of contacts likewise occupying chip area is also reduced. The number of signal and read line extending across the entire width of the storage matrix is reduced to a lines 28, 29, 37 and 38. This reduction to 4 lines leads to a further gain in chip area.

In write-read control units heretofore known, comprising two transistors per bit line, during the write-in process, the read-out transistors are disconnected by the associated write-in transistors so that no more read-out currents flow. On transition from write-in to read-out, differences in switching times in the preliminary stage and intermediate stage can cause one read-out transistor to be conductive while the other transistor is still blocked. An interference signal which is therefore formed in the read-out amplifier extends the write-in recovery time. An effect of this type is fundamentally unable to occur in the write-read control arrangement constructed in accordance with the present invention.

In addition, according to the present invention, the transistors 32 and 33 constantly conduct current, therefore also during write-in, the binary signal to be stored in the selected cell can also be read during write-in. A simultaneous write-read operation of this kind facilitates a read-after-write check during write-in.

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a driving arrangement for driving a bipolar semiconductor memory arranged in the form of a matrix having switching transistors, bit lines and read amplifier means, of the type wherein a preliminary stage includes a write-in and data input and has two information outputs and a status output which is fed with operating state signals, and an intermediate stage and an end stage, with first and second signal lines, connected serially behind the preliminary stage logically linking a read-out amplifier to the outputs of the preliminary stage, the improvement therein, wherein:

the intermediate stage comprises a circuit arrangement connecting the outputs of the preliminary stage to the first and second signal lines, said circuit arrangement comprising a first switching transistor having an input connected to and operated in accordance with the status signals on the status output and having two outputs;

a second switching transistor including an input connected to and operated by one of the information outputs and an output connected to one of the outputs of said first switching transistor and to the first signal line of the end stage; and a third switching transistor having an input connected to and operated by another of the information inputs and an output connected to the other output of said first switching transistor and to the second signal line of the end stage; and the matrix includes a maximum of one additional switching transistor for each bit line connected to and driven by a selected signal line to connect the respective bit line to the read amplifier means.

2. The improved driving arrangement of claim 1, wherein: each of said additional bit line switching transistors for adjacent bit lines of the matrix comprises a double-emitter transistor with each of the emitters connected to a respective adjacent bit line.

* * * * *